United States Patent
Brinker et al.

(10) Patent No.: US 7,146,033 B2
(45) Date of Patent: Dec. 5, 2006

(54) METHOD FOR DETERMINING DISTORTIONS IN AN IMAGE AND CALIBRATION OBJECT THEREFOR

(75) Inventors: Gerhard Brinker, Erlangen (DE); Georg Frese, Herzogeaurach (DE); Franz Hebrank, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 894 days.

(21) Appl. No.: 10/074,655

(22) Filed: Feb. 13, 2002

(65) Prior Publication Data

US 2002/0110268 A1     Aug. 15, 2002

(30) Foreign Application Priority Data

Feb. 14, 2001    (DE) ................................ 101 07 421

(51) Int. Cl.
*G06K 9/00*    (2006.01)
(52) U.S. Cl. ...................................... 382/132; 382/131
(58) Field of Classification Search ................ 382/128, 382/131, 132, 143–145
See application file for complete search history.

(56) References Cited

U.S. PATENT DOCUMENTS 5,877,861 A * 3/1999 Ausschnitt et al. ......... 356/401
6,052,611 A * 4/2000 Yanof et al. ................ 600/429
6,235,038 B1 * 5/2001 Hunter et al. ............... 606/130

FOREIGN PATENT DOCUMENTS

| EP | 0 133 722 | 3/1985 |
|---|---|---|
| EP | 0 159 780 | 10/1985 |
| JP | 63142540 | 12/1989 |

* cited by examiner

*Primary Examiner*—Bhavesh M. Mehta
*Assistant Examiner*—Wes Tucker
(74) *Attorney, Agent, or Firm*—Schiff Hardin LLP

(57) ABSTRACT

In a the method for determining distortions in an image that can be generated with an imaging system from a subject arranged in an imaging volume of the imaging system, a first region of the imaging volume is presented undistorted in the image and a second region of the imaging volume is presented distorted in the image. Using the imaging system, an image of at least three markings that have a known spatial position relative to one another is produced. A first and a second of the three markings are arranged in the first region and a third of the three markings is arranged in the second region. The position of the imaged markings in the image is determined. An ideal position of the third marking in the image is determined from its known spatial arrangement with respect to the first and second markings. A positional difference of the imaged third marking from its ideal position is identified. The positional difference represents a criterion for the distortion.

10 Claims, 3 Drawing Sheets

METHOD FOR DETERMINING DISTORTIONS IN AN IMAGE AND CALIBRATION OBJECT THEREFOR

BACKGROUND OF THE INVENTION

1. Field of the Invention

The present invention is directed to a method for determining distortions in an image, as well as to a calibration object suitable for use in such a distortion-determining method.

2. Description of the Prior Art

In all types of imaging methods such as, for example, imaging methods that generate images of regions of a subject using light optics, X-rays, electron beams, magnetic resonance, etc., the imaging accuracy of the acquired image compared to the examined subject is a decisive quality criterion. As a rule, the imaging accuracy is not ideal in all imaging systems, but distortions in the imaging of the subject occur dependent on the displayed image region and the quality of the imaging system under consideration. In the field of magnetic resonance tomography (MRT), for example, the causes for occurring distortions are established by the location-dependent deviations of the basic magnetic field from an ideal value $B_0$ and the likewise location-dependent non-linearities of the gradient system. Typically the distortions of the image that are observed become greater toward the edge of the image region that is presented. The size of the deformation or distortion usually can be described by a dependency on the distance r from the center of the image that is not linear, but of a higher order. The distortion becomes disproportionately greater toward the edge. In, MR the distortions can be described with spherical surface functions of a higher orderwith terms of the $3^{rd}$, $5^{th}$ and $7^{th}$ order (i.e. proportional to $r^3$, $r^5$ and $r^7$) being the most relevant for modeling in the consideration of non-linearities of the gradient system. The inhomogeneities of a magnet with perfect shimming (i.e. optimally adjusted) are established by terms of the order 8 and above.

The characterization of a particular imaging method under consideration usually covers the description of the realized imaging faithfulness in the form of a quantitative statement of the distortions that occur. As a rule, the deviations of the picture elements from ideal value are thereby recited dependent on the observed image region in absolute or relative values. The necessity of a characterization is particularly important when the imaging method is used, for example, for measuring objects (for example, on the earth's surface) for designing objects (for example, lithography) or in medical diagnostics (for example, computed tomography, x-ray diagnostics, magnetic resonance tomography). In many instances, the determination of the imaging accuracy is in fact possible with good precision; however, the underlying measuring method is complex and often requires specifically fabricated test objects that are not handy and are expensive. In these cases, a check is then usually only possible in a specific environment but not for an arbitrary user of the imaging method within the framework of, for example, a quality or constancy check.

For example, three of the methods currently employed for determining the imaging faithfulness are set forth in brief below.

In the "direct" measurement of the distortion, a known test object having optimally simple geometrical structures is imaged and the distortion of the picture elements observed is directly measured. To this end, the determination of the coordinates of the picture elements and the exact reconstruction of the "ideal" coordinates of the object points that would derive for the case of a true-to-image presentation are needed. However, a pre-requisite for this is that not only the dimensions of the underlying test object that must be exactly known, but also the positioning and alignment of the test object in the imaging volume. This is difficult particularly when the imaging volume has no fixed reference points established a priori and is subject to relatively high imprecision. As a rule, this is the case in all three-dimensional imaging methods.

In the imaging of a uniform grid structure, a two-dimensional or three-dimensional test object having a regular, permanently prescribed arrangement of test points in the form of a grid is employed. This allows the determination of the imaging accuracy over a greater image region. The definition of reference points for the construction of the distortion-free picture elements in Cartesian coordinates can implicitly ensue by using individual object points. However, the problem aligning the object in the direction of the image axes also remains here, since even a slight tilting of the object directly diminishes the precision in the determination of the distortion. A significant disadvantage of this method is also that the preparation of correspondingly exact test objects having many test points, for example a cube having an edge length of 30 cm and a three-dimensional grid space 20 mm is extremely complicated and expensive. When such a phantom is intended to cover a large region of the imaging volume, then a heavy weight of the phantom results, and thus the phantom is difficult manipulation for a user to manipulate.

Finally, various organizations such as, for example, NEMA or the American College of Radiology (ACR) have established measurement rules with which the image quality in magnetic resonance tomography is to be defined. Since, in particular, the ACR in the USA accredits the clinical users of MR in an extensive program, the measuring methods employed have created a type of quasi standard. A simple method upon utilization of a circular or spherical phantom is employed here for evaluating the imaging faithfulness. The determination of the distortion on the circumference of the image circle ensues by repeated distance measurement along the diameter from one point to the point to the point lying opposite. The distortion in the radial direction then is derived by comparison to the known diameter of the test object. The advantage of this method is that a spherical phantom is usually already supplied by the manufacture for each MR system, and the measurement and evaluation are simple to implement. A specific phantom, which represents an additional expense, is employed for the measurements in the case of the cost-incurring ACR accreditation; however, only the distance measurement of the outside edges is likewise employed for the evaluation. A disadvantage in the use of the standard phantoms (for example, 170 mm and 240 mm diameter) and the use of the ACR phantom is that these are significantly smaller then the possible imaging region, which typically has a 500 mm field of view (FOV). The determination of the imaging faithfulness is thus also possible only in a very limited image region. The use of a larger phantoms is fundamentally possible but these are expensive due to their manufacture and are also very heavy above a size of 300 mm diameter and are thus difficult to handle. A further disadvantage of this method is that the distortion, caused by the measurement can be measured only along the radial direction given simultaneous observation of two distorted picture elements. Only the average value of the distortions of the two picture elements and not that of a specific point thus can be measured. Moreover, only the radial component of the distortion of the picture elements is identified, but not the complete shift of the points with magnitude and direction, i.e. vectorially.

SUMMARY OF THE INVENTION

An object of the invention is to prove a simple method for determining distortions in an image as well as a calibration object for use in a distortion determining method.

The first object is achieved in a method for determining distortions in an image, the image being generated with an imaging system from a subject arranged in an imaging volume of the imaging system, with a first region of the imaging volume being presented undistorted in the image and a second region of the imaging volume being presented distorted in the image.

Using the imaging system, an image of at least three markings that have a known spatial position relative to one another is produced. A first and a second of the three markings are arranged in the first region and a third of the three markings is arranged in the second region.

The position of the imaged markings in the image is determined.

An ideal position of the third marking in the image is determined from its known spatial arrangement with respect to the first and second markings.

A positional difference of the imaged third marking from its ideal position is determined, this positional difference being a criterion for the distortion.

The inventive method utilizes a property of an imaging system, namely that no distortion, or only negligibly small distortions, occur in an adequately large imaging region. This fact is then employed in order, proceeding from two known points that are reproduced true-to-the image in the picture, to construct a picture element that was in fact imaged at a different location due to distortions.

The method can be applied to two-dimensional as well as to three-dimensional imaging methods. An exact adjustment of the test subject (calibration object) that is employed is not necessary in the imaging volume. The test subject need not fill out the entire imaging volume in order to be able to determine the distortion in all regions. The determination of the distortion at the location of a measurement point can already ensue on the basis of two simple distance measurements. The distortion, i.e. the shift of the picture elements, can then be vectorially characterized with magnitude and spatial direction. The measuring precision of the method is essentially dependent only on the measurement error in the distance measurements and on the resolution of the imaging method.

The distortion data that are acquired also can be utilized for a correction of images, for example by implementation of a distortion correction in the imaging method. The method can be applied to all types of imaging systems, particularly to imaging systems that operate according to the following imaging methods:

Imaging by electromagnetic radiation:
  Light: all types of light-optical imaging such as, for example, photography and applications derived therefrom such as, for example, holography.
  Infrared: such as, for example, thermal imaging, night vision methods.
  UV radiation: such as, for example, photolithography
  X-radiation: such as for example, in medical diagnostics.
  Magnetic Fields: such as, for example, in magnetic resonance tomography;

Imaging by sound waves:
  Sonography: for example, medical diagnostics; Imaging by corpuscular radiation:
  For example, by electron radiation such as all types of electronic microscopy, electron lithography, picture tube screens, CRTs (cathode ray tubes) such as television screens or computer monitors;

All other imaging devices: such as, for example, LCT displays.

The method also can be utilized for arbitrary fields of application such as, for example, in all types of photography, in quality testing, particularly for regular (constancy) checking by the user, in all types of measuring methods, in diagnostics, particularly in medicine as well, and in the determination of the quality of picture screens.

The second object is achieved by a calibration object for the implementation of the above-described method having a holder for three markings that contain a substance capable of being imaged.

The test object for quality testing of the imaging system (calibration object) is constructed in a simple way and therefore can be manufactured economically. The three markings also can be established, for example, by the corners of a rectangular test object capable of being imaged. In the case of magnetic resonance imaging systems, a standard phantom bottle can be employed as calibration object, this being characterized by its longitudinal section.

A simple realization of the test object is a rod having three bores wherein the markings are arranged. The test object can be arbitrarily expanded in order to cover any desired image region with a measurement. The selective scaling is typically based on the manufacture or acquisition costs of the test object compared to the outlay in the implementation of the measurements that are needed for the determination of the distortion in a larger image region.

DESCRIPTION OF THE PREFERRED EMBODIMENTS

Figure 1:
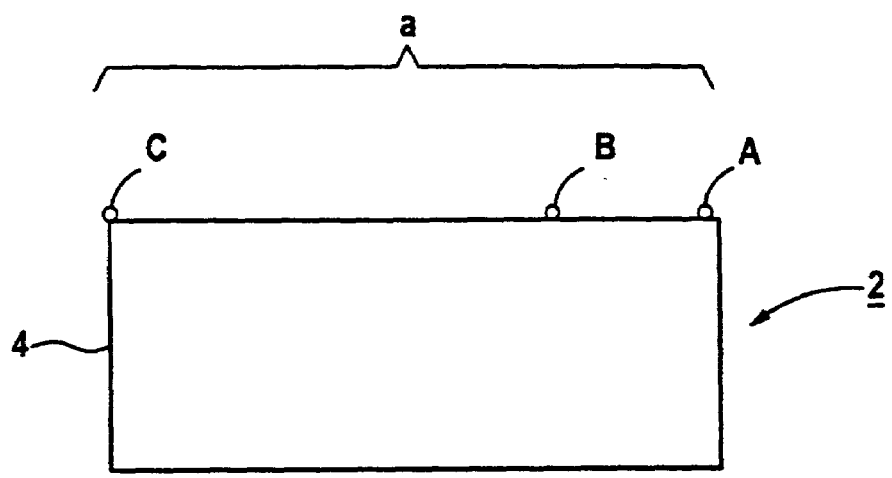
FIG. 1 is a plan view of a calibration object for determining distortions in images in accordance with the invention.

The calibration object 2 shown in plan view in FIG. 1 is composed of a thin, cuboid carrier member 4 having a long side at which three markings A, B, C, having a known position relative to one another, are secured. The markings A and C are arranged at a distance 'a' from one another. The markings A, B, C have a circular-cylindrical volume that contains a substance capable of being imaged with an imaging system. The longitudinal axes of the circular-cylindrical volume are directed perpendicular to the visible cuboid surface. For example, a plexiglass rod can be employed as carrier member 4 for checking the imaging distortions in a diagnostic magnetic resonance apparatus, water-filled bores being introduced into the rod 4 as the markings A, B, C.

Figure 2:
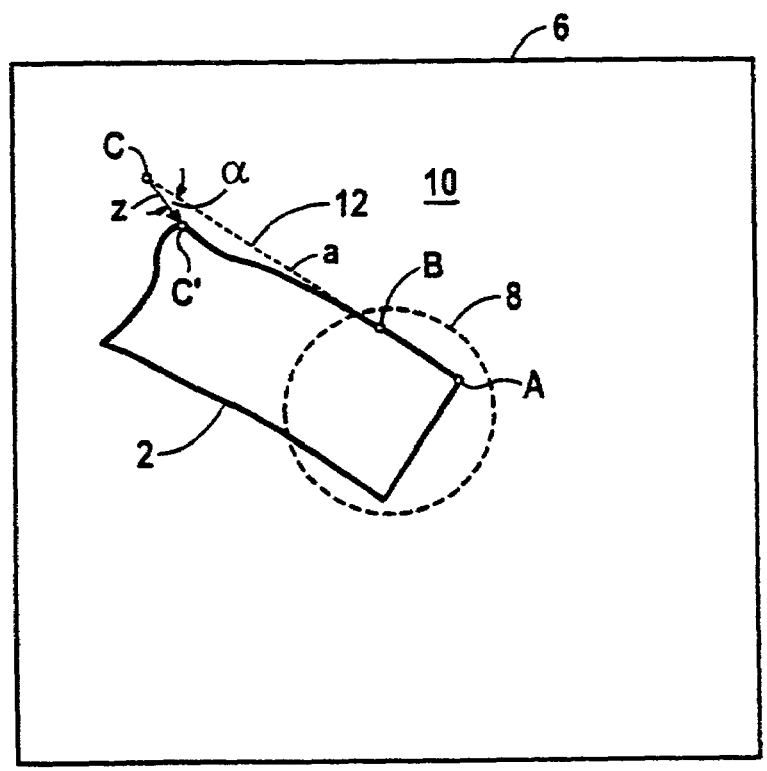
FIG. 2 is a schematic illustration of the determination of distortions according to a first version of the method.

The fundamental relationships of the method for determining distortions that are caused by the imaging system in an image 6 are explained on the basis of FIG. 2. To that end, the calibration object 2 is placed in an imaging volume of the imaging system. An imaging property of the imaging system is utilized, namely that a first region 8 of the imaging volume is presented undistorted (i.e. no distortion or deformation or only a negligibly slight distortion or deformation) in the image 6, in contrast to which a second region 10 of the imaging volume is presented distorted in the image 6. The placement of the calibration object in the imaging volume must ensue such that two markings, A and B here, lie in the first region, and the third marking C comes to lie at a location at which the distortion is to be measured, i.e. in the second region 10.

After an image 6 of the calibration object 2 has been produced with the imaging system, for example a magnetic resonance measurement has been implemented with a suitable imaging sequence, an interpretation of the imaged markings A, B, C ensues. The presentation of the image 6 ensues, for example, in the form of a two-dimensional matrix composed of individual picture elements (pixels). First, the coordinates of the imaged markings A, B, C are determined. This can ensue by means of a systematic check of all pixels of the image, whereby a pixel belongs to one picture element of A, B, C when its brightness value exceeds a characteristic threshold. An identification of the picture elements and allocation to the markings A, B, C subsequently ensues by comparing the coordinates that have already been identified. The picture elements of A and B, compared to the picture element of C, have a smaller spacing from the image center. As a result of the distortion by the imaging system, however, the image of C shifts to C'. A straight line 12 is constructed that proceeds through the image of A and B. The construction of straight lines from two given straight line points is a standard functionality in corresponding analysis programs such as, for example, CAD (computer aided design programs). Since the spacing 'a' of the markings A and B is known, the coordinates of the ideal or distortion-free image point of C can be identified. Finally, the spacing of the ideal image point from the actual image point C' is defined according to the magnitude z and angle a relative to the straight line 12. The values of z and a and the coordinates of the ideal picture element are logged. The logged values are then output at a picture screen as result for a user. For example, the distortion and location C is indicated with a direction vector having the magnitude z and the angle α.

The direction vector of the distortion having the magnitude z and the angle α then can be determined by a triangulation, as explained below with reference to FIGS. 3 and 4.

Figure 3:
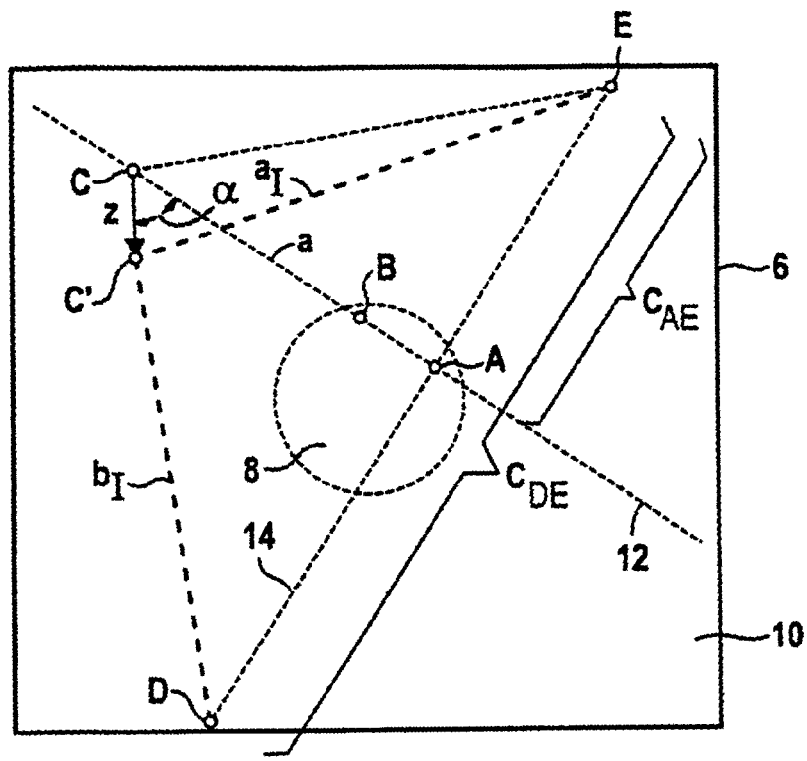
FIG. 3 is a schematic illustration of the determination of distortions according to a second version of the method.

Corresponding to that is shown in FIG. 3, an auxiliary straight line 14 is constructed through the picture of the marking A, this proceeding perpendicular to the connecting straight line 12 in an especially advantageous way. Two arbitrary points D and E are selected on the auxiliary straight line 14. It is advantageous from the two points D, E are arranged optimally at the edge of the image 6, so that a possible measuring error becomes minimum. The distance between the points D and E is referenced $C_{DE}$ in FIG. 3. The distance between the points A and E is identified; it is referenced $C_{AE}$ in FIG. 3. Proceeding from the points D and E, the distances $b_i$ or $a_i$ to the picture element C' are then identified. The application of plane trigonometry, particularly of the law of cosines, enables the calculation of the shift of the picture element C' with the amount z and direction angle α.

Figure 4:
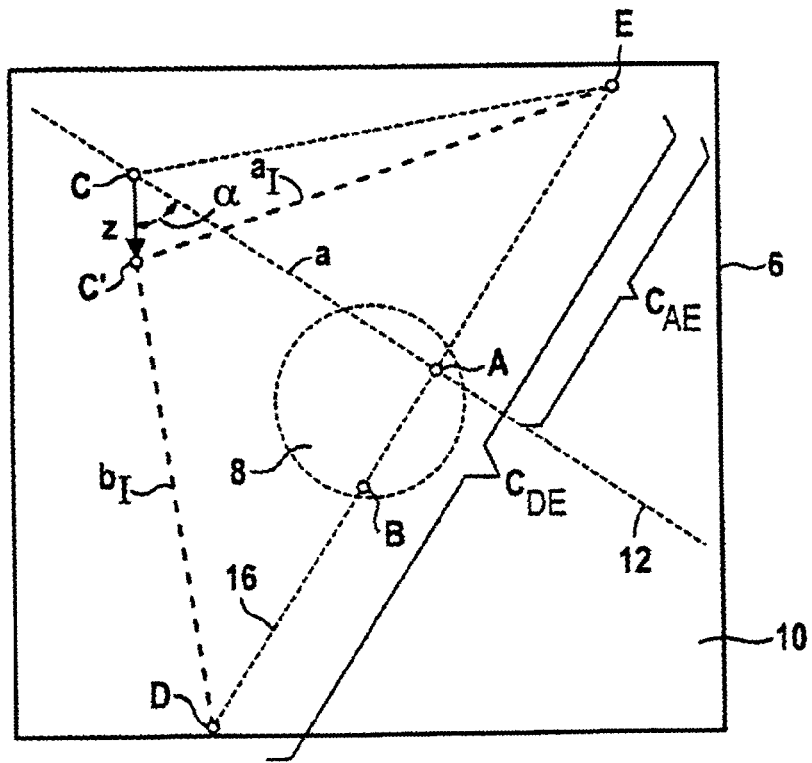
FIG. 4 is a schematic illustration of the determination of distortions according to a third version of the method.

Given the version shown in FIG. 4, the markings A, B and C at the calibration object form a triangle that forms a right angle at A in an especially advantageous way. An auxiliary straight line 16 is drawn through the picture elements A and B, up to the edge of the image 6 with an especially advantageous extent. Further, the straight line 12 is drawn through the image of the marking A corresponding to the angle prescribed by the triangle; the ideally imaged marking C would lie on said straight line 12 with the spacing 'a'. Two arbitrary points D and E are selected on the auxiliary straight line 16. It is especially advantageous to arrange the two points as close as possible to the edge of the image, so that a possible measuring error also becomes minimum here. The distance $C_{DE}$ between the points D and E and the distance $C_{AE}$ between the points A and E is identified. Proceeding from the points D and E, the two distances $b_i$ or $a_i$ from the picture element C' are identified. The application of plane trigonometry, particularly the law of cosines, also enables the calculation here of the shift of the picture element C' with magnitude z and direction angle α.

Figure 5:
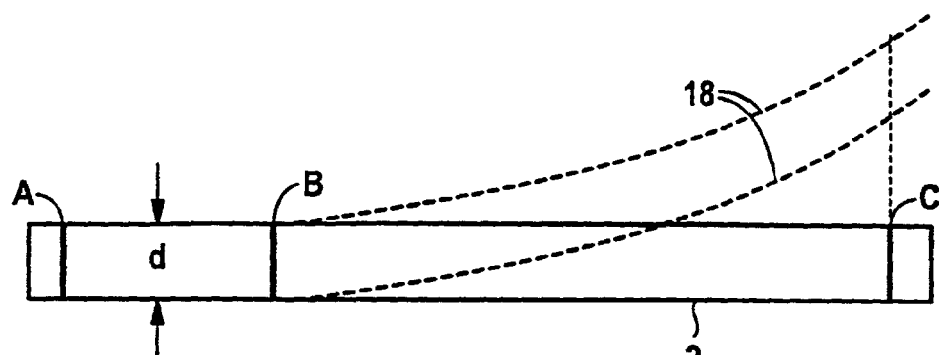
FIG. 5 is a side view showing a schematic illustration for explaining the problem of imaging a curved imaging slice.

The method can be easily expanded to a three-dimensional image, whereby the two-dimensional image of a slice (tomogram) arbitrarily oriented in space is generated. It must then be taken into consideration that the markings A, B, C in the calibration object have an adequate expanse d in perpendicular direction relative to the image slice and lie in the slice that is in fact imaged. A curved image slice, as shown in FIG. 5 in a side view with two broken lines 18, dare not proceed outside the calibration body 2 and the markings A, B, C. Given the course of the curved imaging slice shown in FIG. 5, the" marking C would not be presented in the image. The thickness d of the calibration object 2 must be correspondingly enlarged in this case so that all markings A, B, C are imaged.

Figure 6:
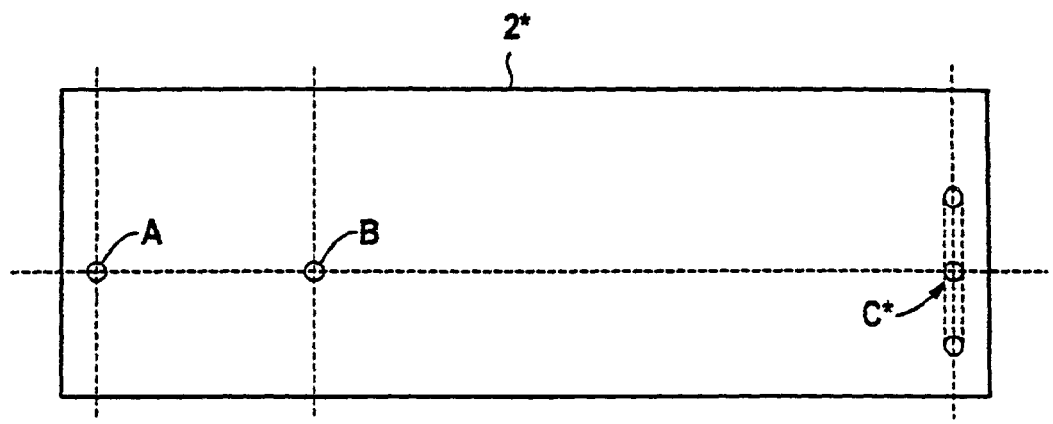
FIG. 6 is a plan view showing a further calibration object in accordance with the invention for recognizing curved imaging slices.

In order to obtain a criterion for the imaging error given an incorrectly curved imaging slice, a somewhat differently designed marking C* is employed compared to the marking C. FIG. 6 shows a plan view of a calibration object 2* having the modified marking C*.

Figure 7:
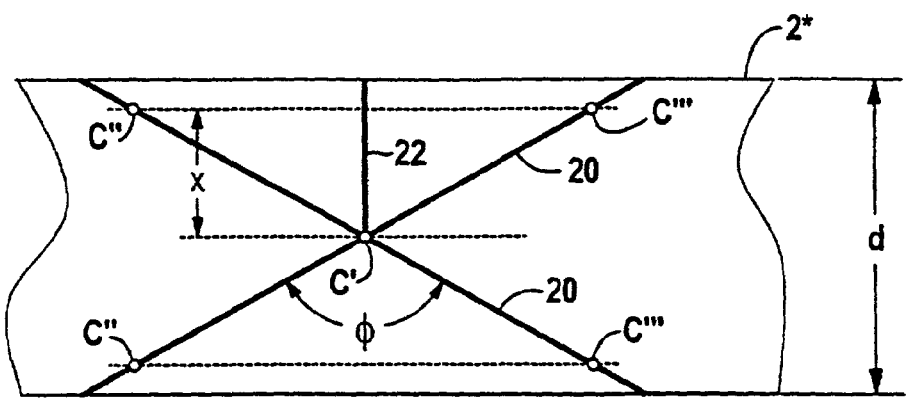
FIG. 7 is a side view showing a detailed illustration of a part of the further calibration object.

In an enlarged view, FIG. 7 shows the marking according to FIG. 6 in a side view. The modified marking C* has two small rods 20 that cross one another and proceeds symmetrically obliquely relative to the slice to be imaged, said small rods 20 containing a substance capable of being imaged. The angle between the small rods 20 is referenced φ. In the imaging of the calibration object 2*, the image of C* is presented with a single picture element C' only given a planar, curvature-free slice. Given a distortion perpendicular to the slice (slice curvature, see FIG. 5), in contrast, two picture elements C''' of C* are imaged, these being defined by the intersection of the curved image plane and the two rods 20.

The distortion x at the location of the marking C* perpendicular to the imaging slice is directly established by the distance between the two picture elements C''' and C''' and the angle φ.

The direction, i.e. the polarity, of the distortion can be additionally identified by a third small rod 22 that ends in the point of intersection of the two rods 20. Dependent on whether the third small rod 22 can be seen in the image, a distortion toward the one or other direction can be assumed.

All exemplary embodiments allow the direct determination of the distortion z of a picture element with magnitude and direction but differ in view of their typical measuring errors and in view of the structure and the simplicity of the calibration object.

Given a purely radial distortion, the first version of the method with three markings arranged in a straight line is superior to the two other versions wherein the three markings are not arranged in a straight row and wherein the images are evaluated with a triangulation in view of the determination of the amount of distortion. When, however, the distortion vector also contains a tangential component, then the measuring error in the triangulation is less beginning with a specific angle of the distortion vector. The triangulation generally has the advantage given the determination of the angle of the distortion.

Although modifications and changes may be suggested by those skilled in the art, it is in the intention of the inventors to embody within the patent warranted hereon all changes and modifications as reasonably and properly come within the scope of their contribution to the art.

We claim as our invention:

1. A method for determining distortions in an image comprising the steps of:

arranging a living subject in an imaging volume of a medical imaging system and obtaining a medical image of said subject in said imaging volume, with a first region of said imaging volume appearing undistorted in said medical image and a second region of said imaging volume appearing distorted in said medical image;

prior to obtaining said medical image of said subject, obtaining a single image, using said medical imaging system, of at least three simultaneously-present markings having a known spatial position relative to each other, with a first and a second of said three markings being disposed in said first region and a third of said three markings being disposed in said second region;

determining respective positions of said markings in said single image of said markings;

determining an ideal position of said third marking in said single image of said markings from the known spatial position of said third marking relative to said first and second markings; and determining a positional difference of the image of the third marking in said single image of said markings from said ideal position, and employing said positional difference as a criterion for distortion in said medical image.

2. A method as claimed in claim 1 comprising generating an imaging scale from the distance of the first marking in said single image of said markings from the distance of said second marking in said single image of said markings.

3. A method as claimed in claim 1 comprising arranging said three markings in a straight row behind one another.

4. A method as claimed in claim 1 comprising determining said ideal positioning of said third marking by a straight line that proceeds through the image of said first marking and the image of said second marking in said single image of said markings, and by a known distance of said third marking from said first marking and said second marking.

5. A method as claimed in claim 1 comprising arranging said three markings in a single plane.

6. A method as claimed in claim 5 comprising disposing the three markings at respective corners of a right triangle.

7. A method as claimed in claim 6 comprising determining said positional difference by triangulation.

8. A method as claimed in claim 1 wherein said image of said markings has a middle region, and obtaining said single image of said markings so that said first region is disposed in said middle region of said image of said markings.

9. A method as claimed in claim 1 wherein said three markings are arranged in a single plane and wherein said single image of said markings has a center, and comprising identifying the respective markings in said single image of said markings from respective distances of the markings in said single image of said markings from said center.

10. A method as claimed in claim 1 comprising generating said single image of said subject and said single image of said markings by nuclear magnetic resonance imaging.

* * * * *